(12) United States Patent
Sonobe et al.

(10) Patent No.: US 11,513,002 B2
(45) Date of Patent: Nov. 29, 2022

(54) LIGHT DETECTION DEVICE HAVING TEMPERATURE COMPENSATED GAIN IN AVALANCHE PHOTODIODE

(71) Applicant: HAMAMATSU PHOTONICS K.K., Hamamatsu (JP)

(72) Inventors: Hironori Sonobe, Hamamatsu (JP); Takahiro Kondo, Hamamatsu (JP); Kazuaki Maekita, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/311,756

(22) PCT Filed: Nov. 29, 2019

(86) PCT No.: PCT/JP2019/046900
§ 371 (c)(1),
(2) Date: Jun. 8, 2021

(87) PCT Pub. No.: WO2020/121854
PCT Pub. Date: Jun. 18, 2020

(65) Prior Publication Data
US 2022/0026268 A1   Jan. 27, 2022

(30) Foreign Application Priority Data

Dec. 12, 2018 (JP) .............................. JP2018-232892
Dec. 12, 2018 (JP) .............................. JP2018-232895
Sep. 26, 2019 (JP) .............................. JP2019-175945

(51) Int. Cl.
*G01J 1/44* (2006.01)
*G01J 1/42* (2006.01)
(Continued)

(52) U.S. Cl.
CPC ............... *G01J 1/44* (2013.01); *G01J 1/0252* (2013.01); *G01J 1/4228* (2013.01); *H01L 31/10* (2013.01);
(Continued)

(58) Field of Classification Search
CPC ...... G01J 1/44; G01J 1/4228; G01J 2001/444; G01J 2001/4466; G01J 1/0252; H01L 31/10; H01L 31/107
See application file for complete search history.

(56) References Cited

U.S. PATENT DOCUMENTS 4,464,048 A     8/1984  Farlow
4,948,989 A *   8/1990  Spratt ...................... G05F 3/16
                                                        257/106
(Continued)

FOREIGN PATENT DOCUMENTS

GB    1503088 A      3/1978
JP    S50-062389 A   5/1975
(Continued)

OTHER PUBLICATIONS

International Preliminary Report on Patentability dated Jun. 24, 2021 for PCT/JP2019/046909.
(Continued)

*Primary Examiner* — Jennifer D Bennett
(74) *Attorney, Agent, or Firm* — Faegre Drinker Biddle & Reath LLP

(57) ABSTRACT

A light detection device includes an APD, a plurality of temperature compensation diodes, and a circuit unit. The plurality of temperature compensation diodes have different breakdown voltages lower than a breakdown voltage of the APD. The circuit unit puts any one of the plurality of temperature compensation diodes into a breakdown state. The circuit unit includes a plurality of terminals and a
(Continued)

terminal. The plurality of terminals are respectively connected to electrodes of the mutually different temperature compensation diodes. The terminal is electrically connected to the APD and electrodes of the temperature compensation diodes.

5 Claims, 7 Drawing Sheets

(51) Int. Cl.
  *G01J 1/02* (2006.01)
  *H01L 31/10* (2006.01)
  *H01L 31/107* (2006.01)

(52) U.S. Cl.
  CPC ...... *H01L 31/107* (2013.01); *G01J 2001/444* (2013.01); *G01J 2001/4466* (2013.01)

(56) References Cited

U.S. PATENT DOCUMENTS

| | | | |
|---|---|---|---|
| 5,548,112 A * | 8/1996 | Nakase | H01L 31/107 250/214 R |
| 6,313,459 B1 | 11/2001 | Hoffe et al. | |
| 9,954,124 B1 | 4/2018 | Kuznetsov | |
| 10,064,585 B2 * | 9/2018 | Kimura | A61B 6/4241 |
| 2012/0101614 A1 | 4/2012 | Ghaemi et al. | |
| 2015/0177394 A1 | 6/2015 | Dolinsky et al. | |
| 2018/0180473 A1 | 6/2018 | Clemens et al. | |
| 2018/0214057 A1 | 8/2018 | Schultz et al. | |

FOREIGN PATENT DOCUMENTS

| | | |
|---|---|---|
| JP | S53-041280 A | 4/1978 |
| JP | S55-006924 U | 1/1980 |
| JP | S55-127082 A | 10/1980 |
| JP | S60-178673 A | 9/1985 |
| JP | S60-180347 A | 9/1985 |
| JP | S60-211886 A | 10/1985 |
| JP | S61-038975 U | 3/1986 |
| JP | S61-289677 A | 12/1986 |
| JP | S62-239727 A | 10/1987 |
| JP | S62-279671 A | 12/1987 |
| JP | S64-013768 A | 1/1989 |
| JP | H03-021082 A | 1/1991 |
| JP | H03-278482 A | 12/1991 |
| JP | H04-111477 A | 4/1992 |
| JP | H04-256376 A | 9/1992 |
| JP | H05-235396 A | 9/1993 |
| JP | H05-275668 A | 10/1993 |
| JP | H06-224463 A | 8/1994 |
| JP | H07-027607 A | 1/1995 |
| JP | H08-207281 A | 8/1996 |
| JP | H10-247717 A | 9/1998 |
| JP | 2002-204149 A | 7/2002 |
| JP | 2002204149 A * | 7/2002 |
| JP | 2004-281488 A | 10/2004 |
| JP | 2004-289206 A | 10/2004 |
| JP | 2004-303878 A | 10/2004 |
| JP | 2006-080416 A | 3/2006 |
| JP | 2007-266251 A | 10/2007 |
| JP | 2007-281509 A | 10/2007 |
| JP | 2008-148068 A | 6/2008 |
| JP | 2009-038157 A | 2/2009 |
| JP | 2013164263 A * | 8/2013 |
| SE | 417145 B | 2/1981 |

OTHER PUBLICATIONS

International Preliminary Report on Patentability dated Jun. 24, 2021 for PCT/JP2019/046900.

International Preliminary Report on Patentability dated Jun. 24, 2021 for PCT/JP2019/046901.

International Preliminary Report on Patentability dated Jun. 24, 2021 for PCT/JP2019/046881.

International Preliminary Report on Patentability dated Jun. 24, 2021 for PCT/JP2019/046880.

International Preliminary Report on Patentability dated Jun. 24, 2021 for PCT/JP2019/046907.

International Preliminary Report on Patentability dated Jun. 24, 2021 for PCT/JP2019/046908.

* cited by examiner

LIGHT DETECTION DEVICE HAVING TEMPERATURE COMPENSATED GAIN IN AVALANCHE PHOTODIODE

TECHNICAL FIELD

The present invention relates to a light detection device.

BACKGROUND ART

A configuration is known in which a bias voltage applied to an avalanche photodiode is controlled in order to provide stable light detection with respect to temperature (for example, Patent Literature 1). In Patent Literature 1, a voltage corresponding to the breakdown voltage of a temperature compensation diode is applied to the avalanche photodiode as a bias voltage. Hereinafter, in this specification, the "avalanche photodiode" will be referred to as an "APD".

CITATION LIST

Patent Literature

Patent Literature 1: Japanese Unexamined Patent Publication No. H07-27607

SUMMARY OF INVENTION

Technical Problem

In a light detection device, it is excepted to obtain a desired gain in a stable manner with respect to temperature in the APD. However, the gain of the APD changes according to the change in the bias voltage applied to the APD. Even if a constant bias voltage is applied to the APD, the gain of the APD changes as the ambient temperature changes. Therefore, maintaining the gain of the APD constant needs to change the bias voltage applied to the APD according to the ambient temperature.

When the difference voltage between the breakdown voltage of the APD and the bias voltage applied to the APD is controlled to be constant, the change in the gain of the APD is small even if the ambient temperature changes. However, since the breakdown voltage of the APD also changes according to the ambient temperature, it has been very difficult to switch the gain so as to obtain a gain desired according to the situation.

An object of one aspect of the present invention is to provide a light detection device capable of obtaining, in an APD, a gain desired according to a situation in a stable manner with respect to temperature.

Solution to Problem

A light detection device according to one aspect of the present invention includes an APD, a plurality of temperature compensation diodes, and a circuit unit. Each of the plurality of temperature compensation diodes includes first and second electrodes. The plurality of temperature compensation diodes have mutually different breakdown voltages lower than a breakdown voltage of the APD. The circuit unit is configured to cause any one of the plurality of temperature compensation diodes into a breakdown state. The circuit unit includes a plurality of first terminals and a second terminal. The plurality of first terminals are respectively connected to second electrodes of the temperature compensation diodes different from each other. The second terminal is electrically connected to the APD and the first electrode of each of the temperature compensation diodes.

In the one aspect described above, the circuit unit electrically connects the APD and each temperature compensation diode to the second terminal in parallel with each other. In this configuration, when any one of the plurality of temperature compensation diodes is in a breakdown state, a voltage corresponding to the breakdown voltage of the temperature compensation diode in the breakdown state is applied to the APD as a bias voltage. As a result, a difference voltage between the breakdown voltage of the APD and the bias voltage applied to the APD is set, and the APD has a gain corresponding to the difference voltage. Therefore, according to a temperature compensation diode that breaks down, a gain desired according to the situation in the APD can be obtained in a stable manner with respect to the temperature.

In one of the above aspects, the circuit unit may include at least one switch. At least one switch may be electrically connected to a corresponding temperature compensation diode. At least one switch may be configured to switch between a state capable of electrically energizing the corresponding temperature compensation diode and a state incapable of electrically energizing the corresponding temperature compensation diode. The plurality of temperature compensation diodes may include a first temperature compensation diode and a second temperature compensation diode. The second temperature compensation diode may have a higher breakdown voltage than the first temperature compensation diode. The switch may be electrically connected to the first temperature compensation diode. In this case, when the first temperature compensation diode is set by the switch to a state capable of being electrically energized, the first temperature compensation diode preferentially breaks down even if the second temperature compensation diode is in a state capable of being electrically energized. Therefore, the breakdown voltage applied to the APD can be selected from the two breakdown voltages simply by switching the switch electrically connected to the first temperature compensation diode. Accordingly, it is possible to switch a gain desired according to the situation in the APD with simple control.

In the one aspect described above, the at least one switch may be connected to a corresponding first terminal A high voltage is applied between the first electrode of each temperature compensation diode and the APD. Therefore, a control in a case where the switch is electrically connected to the second electrode through the first terminal can be easier than that in a case where the switch is disposed between the first electrode and the APD.

In the one aspect described above, the circuit unit may be configured to be set to a state capable of electrically energizing the second temperature compensation diode regardless of whether or not to be capable of electrically energizing the first temperature compensation diode. In this case, even if the first temperature compensation diode is damaged or a local temperature change occurs in the vicinity where the first temperature compensation diode is disposed, the second temperature compensation diode breaks down. Therefore, the flow of a large current to the APD is prevented, and a failure of the light detection device is prevented.

In the one aspect described above, the plurality of temperature compensation diodes may further include a third temperature compensation diode. The third temperature compensation diode may have a breakdown voltage higher than a breakdown voltage of the first temperature compensation diode and lower than a breakdown voltage of the second temperature compensation diode. The switch may be electrically connected to the third temperature compensation diode. The circuit unit may be configured to switch, by the switch, between a state capable of electrically energizing the third temperature compensation diode and a state incapable of electrically energizing the third temperature compensation diode, in a state incapable of electrically energizing the first temperature compensation diode. In this case, in a state capable of electrically energizing the first temperature compensation diode, the first temperature compensation diode breaks down. In a state incapable of electrically energizing the first temperature compensation diode, the third temperature compensation diode breaks down when the third temperature compensation diode is set in a state capable of being electrically energized. In a state incapable of electrically energizing the first temperature compensation diode, the second temperature compensation diode breaks down when the third temperature compensation diode is set in a state incapable of being electrically energized. In this manner, it is possible to switch a gain desired according to the situation in the APD with simple control.

Advantageous Effects of Invention

According to one aspect of the present invention, it is possible to provide a light detection device capable of obtaining, in an APD, a gain desired according to a situation in a stable manner with respect to temperature.

DESCRIPTION OF EMBODIMENTS

Figure 1:
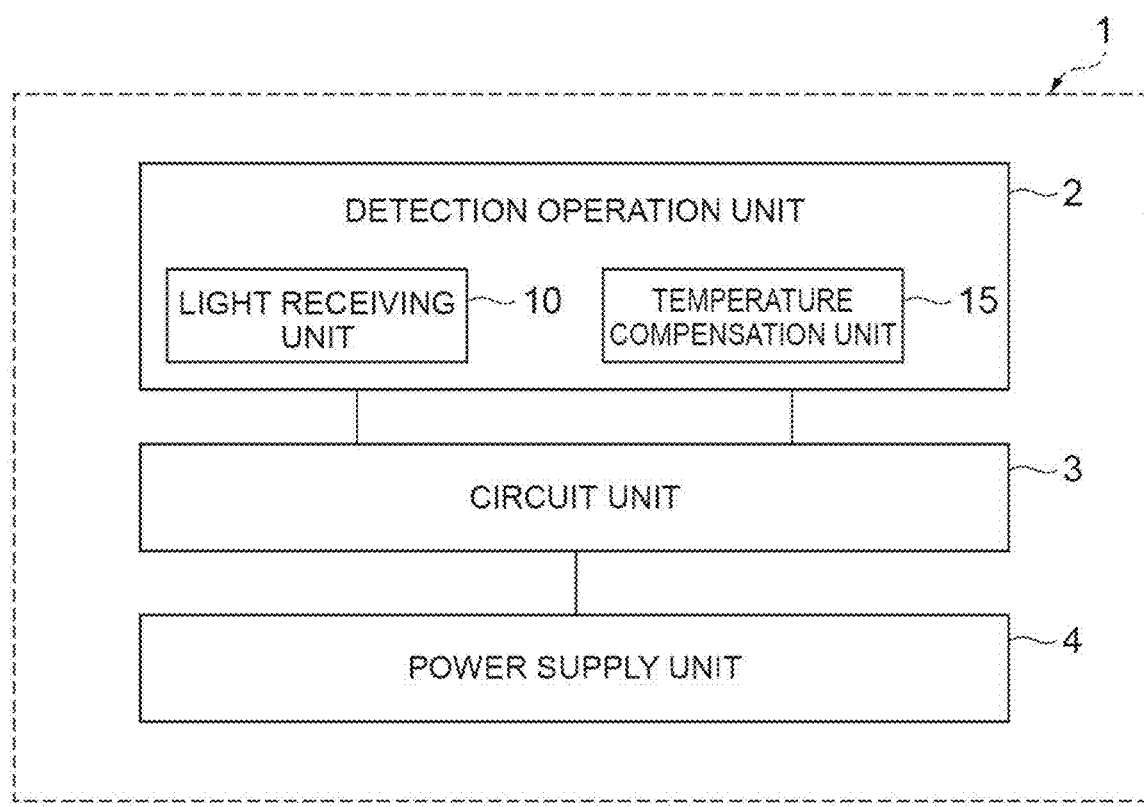
FIG. 1 is a block diagram of a light detection device according to the present embodiment.

Hereinafter, embodiments of the present invention will be described in detail with reference to the accompanying diagrams. In addition, in the description, the same elements or elements having the same function are denoted by the same reference numerals, and repeated descriptions thereof will be omitted.

First, an outline of a light detection device according to the present embodiment will be described with reference to FIG. 1. FIG. 1 is a block diagram of a light detection device. As illustrated in FIG. 1, a light detection device 1 includes a detection operation unit 2, a circuit unit 3, and a power supply unit 4.

The detection operation unit 2 includes a light receiving unit 10 and a temperature compensation unit 15. The light receiving unit 10 includes at least one APD. In the present embodiment, the APD of the light receiving unit 10 is an avalanche photodiode arranged to operate in linear mode.

The temperature compensation unit 15 is configured to provide temperature compensation for the gain in the APD of the light receiving unit 10. The temperature compensation unit 15 is configured to control a bias voltage applied to the APD of the light receiving unit 10. The temperature compensation unit 15 includes a plurality of temperature compensation diodes.

The circuit unit 3 applies a voltage to the light receiving unit 10 and the temperature compensation unit 15 of the detection operation unit 2. The circuit unit 3 is electrically connected to each electrode of the APD of the light receiving unit 10 and the temperature compensation diode of the temperature compensation unit 15. In the present embodiment, the circuit unit 3 applies, to the APD of the light receiving unit 10, a voltage which causes the temperature compensation diode included in the temperature compensation unit 15 to break down.

The power supply unit 4 generates an electromotive force for operating the detection operation unit 2. The power supply unit 4 applies, through the circuit unit 3, a potential to the APD of the light receiving unit 10 and the temperature compensation diode of the temperature compensation unit 15 in the detection operation unit 2. The power supply unit 4 causes the temperature compensation diode included in the temperature compensation unit 15 to break down.

By applying a breakdown voltage to any one of the temperature compensation diodes of the temperature compensation unit 15, a voltage corresponding to the breakdown voltage is applied to the APD of the light receiving unit 10 as a bias voltage. The temperature compensation diode and the APD have the same temperature characteristics with respect to the relationship between the gain and the bias voltage. In this case, when the ambient temperature changes, the breakdown voltage applied to the temperature compensation diode changes. Due to the change in the breakdown voltage applied to the temperature compensation diode, the bias voltage applied to the APD also changes according to the ambient temperature so that the gain of the APD is maintained. That is, the temperature compensation unit 15 provides temperature compensation for the gain in the APD of the light receiving unit 10.

Figure 2:
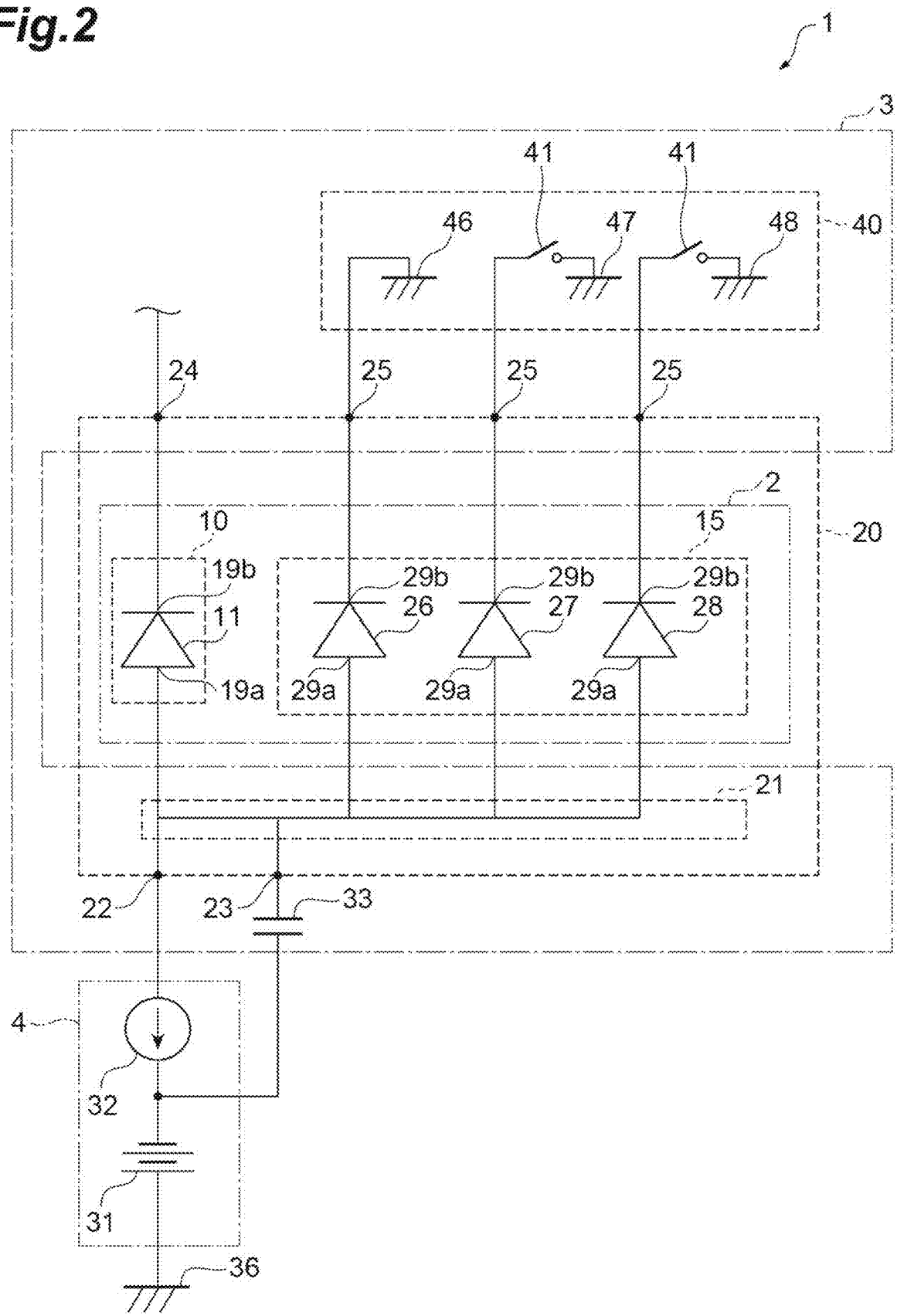
FIG. 2 is a schematic configuration diagram of the light detection device.

Next, an example of the physical configuration of the light detection device 1 will be described in more detail with reference to FIG. 2. FIG. 2 is a schematic configuration diagram of a light detection device. The light detection device 1 includes a light detection unit 20, an electromotive force generation unit 31, a current limiting unit 32, a bias voltage stabilization unit 33, and a setting unit 40. The light detection unit 20 includes the light receiving unit 10 and the temperature compensation unit 15 described above. The electromotive force generation unit 31 generates an electromotive force for operating the light detection unit 20. The current limiting unit 32 limits a current flowing through the light detection unit 20. The bias voltage stabilization unit 33 enables a current output equal to or greater than an upper limit value limited by the current limiting unit 32. The setting unit 40 controls the operation of the light detection unit 20. A part of the light detection unit 20 is included in the detection operation unit 2. A part of the light detection unit 20, the bias voltage stabilization unit 33, and the setting unit 40 are included in the circuit unit 3. The electromotive force generation unit 31 and the current limiting unit 32 are included in the power supply unit 4.

As illustrated in FIG. 2, the light detection unit 20 includes, in addition to an APD 11 and the temperature compensation unit 15, a wiring unit 21 for electrically connecting the temperature compensation unit 15 and the APD 11 to each other and a plurality of terminals 22, 23, 24, and 25. For example, the terminal 22 is a second terminal, and the plurality of terminals 25 are a plurality of first terminals. In this specification, "electrically connects" and "electrically connected" also include a configuration in which the path is temporarily cut by a switch or the like. In the present embodiment, the temperature compensation unit 15 includes three temperature compensation diodes 26, 27, and 28 as a plurality of temperature compensation diodes described above. The temperature compensation unit 15 may include four or more temperature compensation diodes.

The APD 11 and the temperature compensation diodes 26, 27, and 28 are included in the detection operation unit 2. The wiring unit 21 and the plurality of terminals 22, 23, 24, and 25 are included in the circuit unit 3. The APD 11 includes a pair of electrodes 19*a* and 19*b*. Each of the temperature compensation diodes 26, 27, and 28 includes a pair of electrodes 29*a*, 29*b*. For example, when the electrode 29*a* is a first electrode, the electrode 29*b* is a second electrode. For example, the temperature compensation diode 28 is a first temperature compensation diode, the temperature compensation diode 26 is a second temperature compensation diode, and the temperature compensation diode 27 is a third temperature compensation diode.

The temperature compensation diodes 26, 27, and 28 break down at mutually different voltages under the same ambient temperature. Hereinafter, a voltage applied to the corresponding temperature compensation diode when the temperature compensation diodes 26, 27, and 28 break down and a voltage applied to the APD 11 when the APD 11 breaks down are referred to as "breakdown voltages". In the following description, when comparing breakdown voltages, it is assumed that breakdown voltages at the same ambient temperature are compared with each other.

The plurality of temperature compensation diodes 26, 27, and 28 have mutually different breakdown voltages. The temperature compensation diode 26 has a breakdown voltage higher than that of the temperature compensation diode 27. The temperature compensation diode 27 has a breakdown voltage lower than that of the temperature compensation diode 26 and higher than that of the temperature compensation diode 28. The temperature compensation diode 28 has a breakdown voltage lower than those of the temperature compensation diodes 26 and 27. The breakdown voltages of the plurality of temperature compensation diodes 26, 27, and 28 are lower than the breakdown voltage of the APD 11.

The wiring unit 21 connects the electrode 19*a* of the APD 11, the electrode 29*a* of the temperature compensation diode 26, the electrode 29*a* of the temperature compensation diode 27, and the electrode 29*a* of the temperature compensation diode 28 to both the terminal 22 and the terminal 23 in parallel with each other. The wiring unit 21 applies a voltage corresponding to the breakdown voltage of each of the temperature compensation diodes 26, 27, and 28 to the APD 11 as a bias voltage.

The terminal 22 is electrically connected to the electrode 19*a* of the APD 11, the electrodes 29*a* of the temperature compensation diodes 26, 27, and 28, and the current limiting unit 32 of the power supply unit 4. The terminal 23 is electrically connected to the electrode 19*a* of the APD 11, the electrodes 29*a* of the temperature compensation diodes 26, 27, and 28, and the bias voltage stabilization unit 33. The terminal 24 is electrically connected to the electrode 19*b* of the APD 11 and a signal reading circuit (not illustrated). The plurality of terminals 25 are electrically connected to the electrodes 29*b* of the temperature compensation diodes 26, 27, and 28 and the setting unit 40. The respective terminals 25 are connected to the electrodes 29*b* of the temperature compensation diodes 26, 27, and 28 different from each other. In the present embodiment, the electrode 19*a* is the anode of the APD 11 and the electrode 19*b* is the cathode of the APD 11. The electrode 29*a* is the anode of each of the temperature compensation diodes 26, 27, and 28, and the electrode 29*b* is the cathode of each of the temperature compensation diodes 26, 27, and 28.

The electromotive force generation unit 31 and the current limiting unit 32 serving as the power supply unit 4 apply a voltage to the light detection unit 20. The electromotive force generation unit 31 and the current limiting unit 32 are electrically connected to the terminal 22. In the present embodiment, the positive electrode of the electromotive force generation unit 31 is connected to a ground 36, and the negative electrode of the electromotive force generation unit 31 is connected to the terminal 22 through the current limiting unit 32.

The bias voltage stabilization unit 33 increases the upper limit value of the detection signal output from the APD 11. The bias voltage stabilization unit 33 is connected to the light detection unit 20 and the electromotive force generation unit 31 in parallel with the current limiting unit 32. The bias voltage stabilization unit 33 is, for example, a capacitor. In the present embodiment, one electrode of the capacitor is connected to the negative electrode of the electromotive force generation unit 31, and the other electrode is connected to the terminal 23. When a pulse signal output from the APD 11 due to incidence of light is detected, an output having a strength equal to or greater than the current value limited by the current limiting unit 32 is obtained according to the capacitance of the capacitor.

The setting unit 40 is configured to set the temperature compensation unit 15 according to the gain to be set in the APD 11. The setting unit 40 is configured to select a temperature compensation diode to be operated among the plurality of temperature compensation diodes 26, 27, and 28. In other words, the setting unit 40 sets a temperature compensation diode to be used for controlling the bias voltage among the plurality of temperature compensation diodes 26, 27, and 28. The setting unit 40 sets a temperature compensation diode to be operated by controlling the current application states of the plurality of temperature compensation diodes 26, 27, and 28.

The setting unit 40 includes at least one switch 41. At least one switch 41 is connected to a corresponding terminal 25. In the present embodiment, the setting unit 40 includes two switches 41. One switch 41 is electrically connected to the temperature compensation diode 27 through the corresponding terminal 25. The other switch 41 is electrically connected to the temperature compensation diode 28 through the corresponding terminal 25. The switches 41 is configured to switch between a state capable of electrically energizing corresponding temperature compensation diodes 27 and 28 and a state incapable of electrically energizing the corresponding temperature compensation diodes 27 and 28. The setting unit 40 controls ON/OFF of the switch 41.

In the present embodiment, the light detection unit 20 includes three terminals 25. The three terminals 25 are connected to the temperature compensation diodes 26, 27, and 28, respectively. The terminal 25 connected to the temperature compensation diode 26 is connected to a ground 46. The terminal 25 connected to the temperature compensation diode 27 is connected to a ground 47 through the switch 41. The terminal 25 connected to the temperature compensation diode 28 is connected to a ground 48 through the switch 41. That is, only one terminal 25 is not connected to the switch 41. The grounds 46, 47, 48 may be connected to each other. As a modification example of the present embodiment, the switches 41 may be connected to all the terminals 25.

Figure 3:
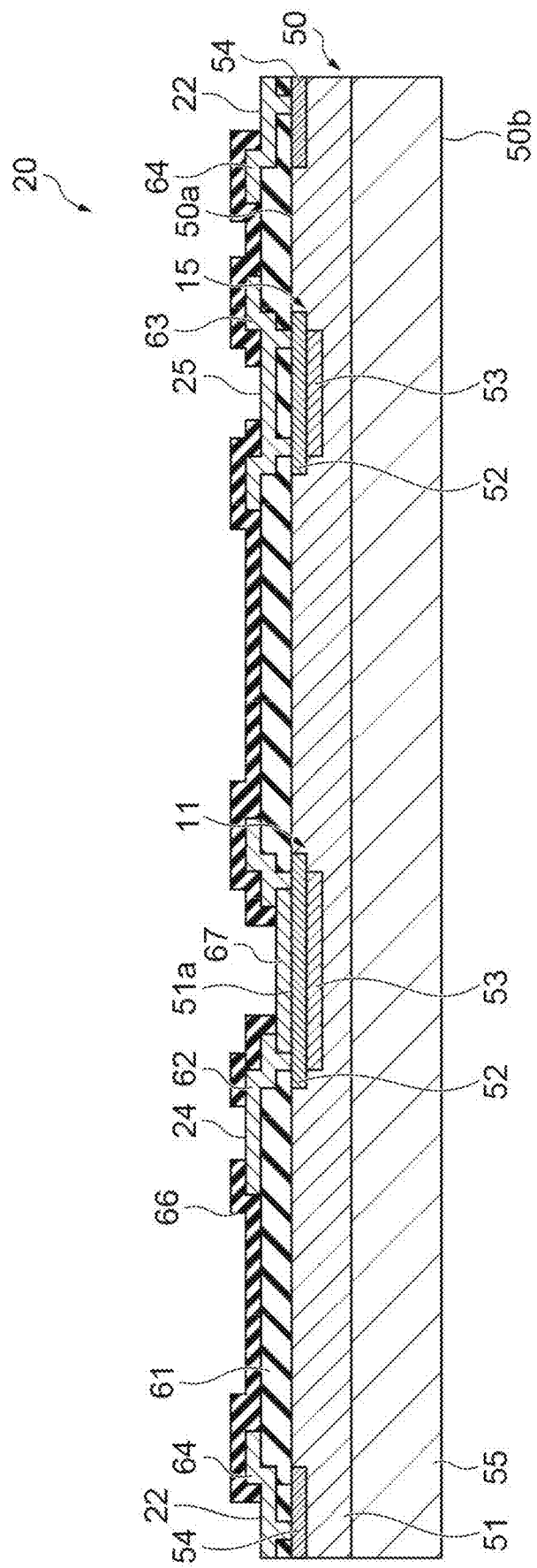
FIG. 3 is a schematic cross-sectional view of a light detection unit.

Next, the structure of the light detection unit 20 in the light detection device 1 will be described in detail with reference to FIG. 3. FIG. 3 is a schematic cross-sectional view of a light detection unit. In FIG. 3, only one of the temperature compensation diodes 26, 27, and 28 is illustrated as the temperature compensation unit 15. In the present embodiment, as illustrated in FIG. 3, the light detection unit 20 is an optical member including a semiconductor substrate 50. The semiconductor substrate 50 has main surfaces 50a and 50b facing each other. The APD 11 and the temperature compensation diodes 26, 27, and 28 are formed on the semiconductor substrate 50 so as to be spaced apart from each other when viewed from a direction perpendicular to the main surface 50a. The APD 11 has a light incidence surface 51a on the main surface 50a side. The temperature compensation diodes 26, 27, and 28 are light-shielded APDs.

The semiconductor substrate 50 includes a semiconductor region 51 and semiconductor layers 52, 53, 54, and 55. Each of the APD 11 and the temperature compensation diodes 26, 27, and 28 includes the semiconductor region 51 and the semiconductor layers 52, 53, and 55.

The semiconductor region 51 and the semiconductor layers 53, 54, and 55 are the first conductive type, and the semiconductor layer 52 is the second conductive type. Semiconductor impurities are added by, for example, a diffusion method or an ion implantation method. In the present embodiment, the first conductive type is P type and the second conductive type is N type. When the semiconductor substrate 50 is an Si-based substrate, a Group 13 element such as B is used as the P-type impurity, and a Group 15 element such as N, P, or As is used as the N-type impurity.

The semiconductor region 51 is located on the main surface 50a side of the semiconductor substrate 50. The semiconductor region 51 forms a part of the main surface 50a. The semiconductor region 51 is, for example, P⁻ type.

The semiconductor layer 52 forms a part of the main surface 50a. The semiconductor layer 52 is surrounded by the semiconductor region 51 so as to be in contact with the semiconductor region 51 when viewed from the direction perpendicular to the main surface 50a. The semiconductor layer 52 is, for example, N⁺ type. In the present embodiment, the semiconductor layer 52 forms a cathode in each of the APD 11 and the temperature compensation diodes 26, 27, and 28.

The semiconductor layer 53 is located between the semiconductor region 51 and the semiconductor layer 52. In other words, the semiconductor layer 53 is in contact with the semiconductor layer 52 on the main surface 50a side and is in contact with the semiconductor region 51 on the main surface 50b side. The semiconductor layer 53 has a higher impurity concentration than the semiconductor region 51. The semiconductor layer 53 is, for example, P type. In the present embodiment, the impurity concentration of the semiconductor layer 53 of each of the temperature compensation diodes 26, 27, and 28 is higher than the impurity concentration of the semiconductor layer 53 of the APD 11. The semiconductor layer 53 forms an avalanche region in each of the APD 11 and the temperature compensation diodes 26, 27, and 28.

The impurity concentration of the semiconductor layer 53 of the temperature compensation diode 27 is higher than the impurity concentration of the semiconductor layer 53 of the temperature compensation diode 26. The impurity concentration of the semiconductor layer 53 of the temperature compensation diode 28 is higher than the impurity concentration of the semiconductor layer 53 of the temperature compensation diode 27.

The semiconductor layer 54 forms a part of the main surface 50a. The semiconductor layer 54 is surrounded by the semiconductor region 51 so as to be in contact with the semiconductor region 51 when viewed from the direction perpendicular to the main surface 50a. In the present embodiment, the semiconductor layer 54 has a higher impurity concentration than the semiconductor region 51 and the semiconductor layer 53. The semiconductor layer 54 is, for example, P⁺ type. The semiconductor layer 54 is connected to the semiconductor layer 55 at a portion that is not illustrated. The semiconductor layer 54 forms an anode of the light detection device 1. The semiconductor layer 54 forms, for example, anodes of the APD 11 and the temperature compensation diodes 26, 27, and 28.

The semiconductor layer 55 is located closer to the main surface 50b of the semiconductor substrate 50 than the semiconductor region 51. The semiconductor layer 55 forms the entire main surface 50b. The semiconductor layer 55 is in contact with the semiconductor region 51 on the main surface 50a side. In the present embodiment, the semiconductor layer 55 has a higher impurity concentration than the semiconductor region 51 and the semiconductor layer 53. The semiconductor layer 55 is, for example, P⁺ type. The semiconductor layer 55 forms an anode of the light detection device 1. The semiconductor layer 55 forms, for example, anodes of the APD 11 and the temperature compensation diodes 26, 27, and 28.

The light detection device 1 further includes an insulating film 61, electrodes 62, 63, and 64, a passivation film 66, and an antireflection film 67 that are provided on the main surface 50a of the semiconductor substrate 50. The insulating film 61 is stacked on the main surface 50a of the semiconductor substrate 50. The insulating film 61 is, for example, a silicon oxide film. Each of the electrodes 62, 63, and 64 is disposed on the insulating film 61. The passivation film 66 is stacked on the insulating film 61 and the electrodes 62, 63, and 64. The antireflection film 67 is stacked on the main surface 50a of the semiconductor substrate 50.

The electrode 62 penetrates the insulating film 61 to be connected to the semiconductor layer 52 of the APD 11. A part of the electrode 62 is exposed from the passivation film 66 to form the terminal 24 of the APD 11. The electrode 62 outputs a signal from the APD 11 at the terminal 24.

The electrode 63 penetrates the insulating film 61 to be connected to the semiconductor layer 52 of each of the temperature compensation diodes 26, 27, and 28. A part of the electrode 63 is exposed from the passivation film 66 to form the terminal 25 of each of the temperature compensation diodes 26, 27, and 28.

The electrode 64 penetrates the insulating film 61 to be connected to the semiconductor layer 54. That is, the electrode 64 is connected to the APD 11 and the temperature compensation diodes 26, 27, and 28. In other words, the APD 11 and the temperature compensation diodes 26, 27, and 28 are connected to the electrode 64 in parallel with each other. A part of the electrode 64 is exposed from the passivation film 66 to form, for example, the terminal 22.

In the present embodiment, the terminal 24 is a pad electrode for the cathode of the APD 11. The terminal 25 is a pad electrode for the cathode of each of the temperature compensation diodes 26, 27, and 28. The terminal 22 is a pad electrode for the anode of each of the APD 11 and the temperature compensation diodes 26, 27, and 28.

The APD 11 and the temperature compensation diodes 26, 27, and 28 are connected to the terminal 22 in parallel with each other. When a reverse bias is applied to the APD 11 and the temperature compensation diodes 26, 27, and 28, a positive voltage is applied to the pad electrode for the cathode, and a negative voltage is applied to the pad electrode for the anode.

The antireflection film 67 is stacked on the semiconductor layer 52 of the APD 11. A part of the antireflection film 67 is exposed from the passivation film 66. Therefore, light transmitted through the antireflection film 67 can enter the semiconductor layer 52 of the APD 11. The semiconductor layer 52 of each of the temperature compensation diodes 26, 27, and 28 is covered with the insulating film 61 and is shielded from light.

Next, the temperature compensation unit 15 will be described in more detail. Each of the APD 11 and the temperature compensation diodes 26, 27, and 28 of the temperature compensation unit 15 have the same temperature characteristics with respect to the relationship between the gain and the bias voltage. In the light detection device 1, a voltage corresponding to the breakdown voltage of each of the temperature compensation diodes 26, 27, and 28 is applied to the APD 11 as a bias voltage.

The temperature compensation unit 15 is configured to control the bias voltage so that the difference voltage between the breakdown voltage of the APD 11 and the bias voltage applied to the APD 11 becomes constant. The difference voltage is determined as follows.

Assuming that the bias voltage applied to the APD is "$V_r$" and the gain of the APD to which the bias voltage is applied is "M", the following equation is satisfied.

[Equation 1]

$$\frac{1}{M} \times \frac{dM}{dV_r} = a \times M + b \quad (1)$$

Figure 4:
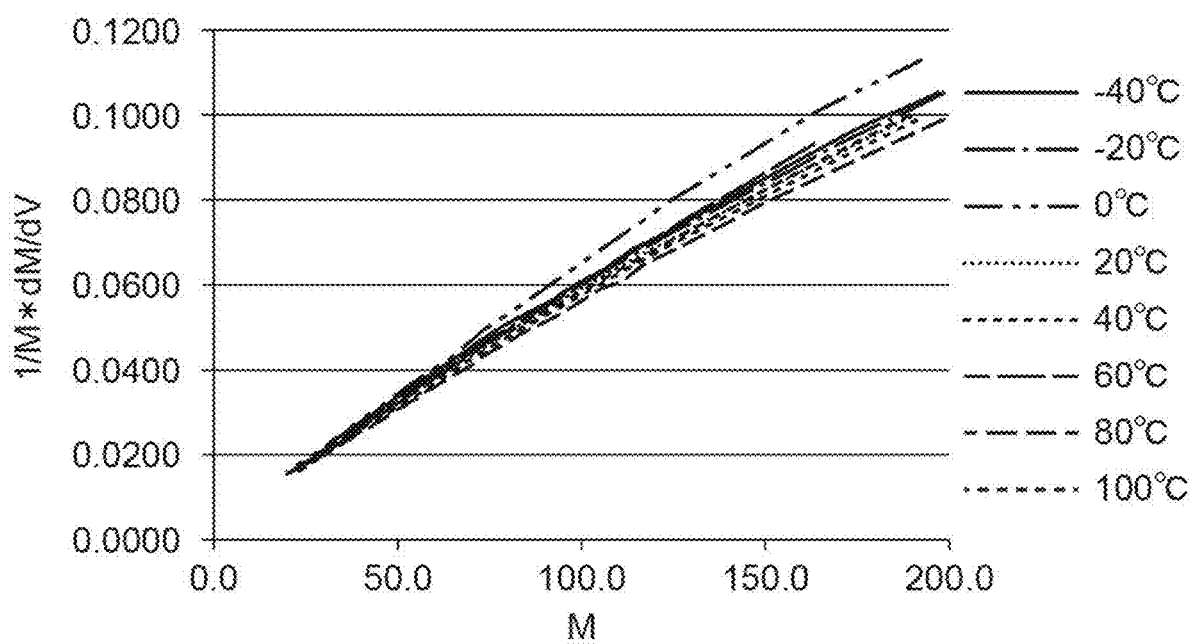
FIG. 4 is a graph of data indicating the relationship between a bias voltage applied to an APD and the gain of the APD to which the bias voltage is applied.
Figure 5:
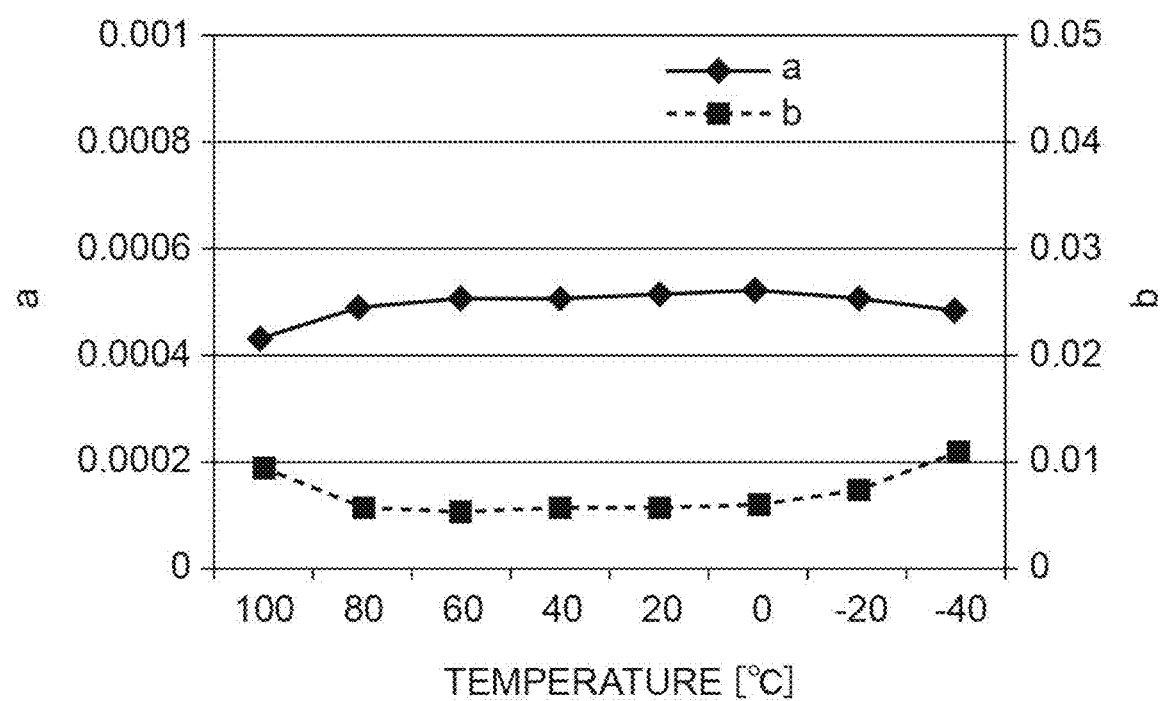
FIG. 5 is a graph illustrating the temperature dependence of the slope and intercept of the regression line.

"A" and "b" are constants. As can be seen from Equation (1), assuming that "$(1/M) \times (dM/dV_r)$" is an objective variable and "M" is an explanatory variable, for data indicating the relationship between the bias voltage and the gain in the APD, a regression line with a slope of "a" and an intercept of "b" is obtained. As illustrated in FIGS. 4 and 5, the slope "a" and the intercept "b" have extremely low temperature dependence. FIG. 4 is a graph of data indicating the relationship between the bias voltage applied to the APD and the gain of the APD to which the bias voltage is applied. In FIG. 4, the horizontal axis indicates the gain of the APD, and the vertical axis indicates the value of "$(1/M) \times (dM/dV_r)$". A plurality of lines indicate data of mutually different ambient temperatures. Specifically, FIG. 4 illustrates data at eight ambient temperatures of 100° C., 80° C., 60° C., 40° C., 20° C., 0° C., −20° C., and −40° C. FIG. 5 is a graph illustrating the temperature dependence of the obtained slope "a" and intercept "b" of the regression line. In FIG. 5, the horizontal axis indicates the ambient temperature, and the vertical axis indicates the values of "a" and "b". The solid line indicates the data of "a", and the broken line indicates the data of "b".

Assuming that the bias voltage applied to the APD is "$V_r$", the gain of the APD to which the bias voltage is applied is "M", and the breakdown voltage of the APD is "$V_{br}$", the following equation is satisfied.

[Equation 2]

$$M = \frac{b/a}{\exp(b(V_{br} - V_r)) - 1} \quad (2)$$

Here, "a" in Equations (1) and (2) indicates the same physical quantity. "b" in Equations (1) and (2) indicates the same physical quantity.

Therefore, by substituting "a" and "b" obtained from Equation (1) into "a" and "b" in Equation (2), the value of "$(V_{br}-V_r)$" for the desired gain is uniquely calculated. "$(V_{br}-V_r)$" is a subtraction value obtained by subtracting the bias voltage applied to the APD from the breakdown voltage of the APD. That is, "$(V_{br}-V_r)$" corresponds to the difference voltage described above.

Assuming that the difference voltage is "$\Delta V$", Equation (2) is expressed as Equation (3).

[Equation 3]

$$\Delta V = \frac{1}{b} \log\left(\frac{b/a}{M} + 1\right) \quad (3)$$

Therefore, by using Equation (4) in which the gain "M" of the APD in Equation (3) is set to a desired gain "$M_d$", "$\Delta V$" corresponding to the desired gain can be easily calculated.

[Equation 4]

$$\Delta V = \frac{1}{b} \log\left(\frac{b/a}{M_d} + 1\right) \quad (4)$$

Specifically, data indicating the relationship between the bias voltage applied to the APD and the gain of the APD to which the bias voltage is applied is acquired at an arbitrary temperature. In the acquired data, the slope of the regression line having "$(1/M) \times (dM/dV_r)$" as an objective variable and "M" as an explanatory variable is substituted into "a" in Equation (4), the intercept of the regression line is substituted into "b" in Equation (4), and the desired gain to be set in the APD 11 is substituted into "$M_d$" in Equation (4). As a result, "$\Delta V$" is calculated. The temperature compensation unit 15 controls the bias voltage applied to the APD 11 so that the difference voltage becomes the calculated "$\Delta V$". Here, the acquired data indicating the relationship between the bias voltage and the gain does not have to be the data of the same APD as the APD 11 as long as the APD has the same material and structure as the APD 11.

In the present embodiment, the difference voltage corresponds to a subtraction value obtained by subtracting a voltage corresponding to the breakdown voltage of each of the temperature compensation diodes 26, 27, and 28 in a breakdown state from the breakdown voltage of the APD 11. In the temperature compensation unit 15, a voltage corresponding to the breakdown voltage of each of the temperature compensation diodes 26, 27, and 28 placed in a breakdown state is applied to the APD 11 as a bias voltage.

In the present embodiment, the breakdown voltage of the APD 11 and the breakdown voltage of each of the temperature compensation diodes 26, 27, and 28 have mutually different values. By adjusting the impurity concentration of the semiconductor layer 53 of each of the temperature compensation diodes 26, 27, and 28 and the impurity concentration of the semiconductor layer 53 of the APD 11, the difference voltage between the breakdown voltage of the APD 11 and the breakdown voltage of each of the temperature compensation diodes 26, 27, and 28 is adjusted. As a modification example of the present embodiment, the difference voltage may be adjusted depending on the circuit configuration. The difference voltage may be adjusted by applying an external voltage to the terminal 25. In the case of these modification examples, the breakdown voltage of the APD 11 and the breakdown voltage of any one of the temperature compensation diodes 26, 27, and 28 may be equal to each other. The difference voltage may be adjusted by combining these plurality of methods.

In the present embodiment, the impurity concentration of the semiconductor layer 53 of each of the temperature compensation diodes 26, 27, and 28 is higher than the impurity concentration of the semiconductor layer 53 of the APD 11. As a result, the breakdown voltage of the APD 11 is higher than the breakdown voltage of each of the temperature compensation diodes 26, 27, and 28 by "ΔV". The three temperature compensation diodes 26, 27, and 28 have mutually different breakdown voltages. The three temperature compensation diodes 26, 27, and 28 are designed to obtain mutually different gains. "ΔV" is calculated for each of the temperature compensation diodes 26, 27, and 28 according to Equation (4), and the impurity concentration of the semiconductor layer 53 of each of the temperature compensation diodes 26, 27, and 28 is designed according to each calculated "ΔV". When calculating "ΔV" for each of the temperature compensation diodes 26, 27, and 28, the same value is substituted into "a". Similarly, when calculating "ΔV" for each of the temperature compensation diodes 26, 27, and 28, the same value is substituted into "b".

In the light detection device 1, since a breakdown voltage of each of the temperature compensation diodes 26, 27, and 28 is applied, the breakdown voltage is applied to the APD 11 as a bias voltage. In the present embodiment, one of the breakdown voltages of the plurality of temperature compensation diodes 26, 27, and 28 is applied to the APD 11 as a bias voltage. Which of the breakdown voltages of the plurality of temperature compensation diodes 26, 27, and 28 is to be applied to the APD 11 as a bias voltage is controlled by the setting unit 40.

Next, the operation of the light detection device according to the present embodiment will be described.

In the present embodiment, the terminal 22 is connected to the semiconductor layer 54 of the P+ type, and the semiconductor layer 54 is connected to the semiconductor layer 55 of the P+ type. Therefore, the anodes of the APD 11 and the temperature compensation diodes 26, 27, and 28 are connected to the terminal 22 in parallel with each other. As a result, a negative potential is applied to the anodes of the APD 11 and the temperature compensation diodes 26, 27, and 28 by the power supply unit 4.

The circuit unit 3 causes one of the plurality of temperature compensation diodes 26, 27, or 28 to break down. The setting unit 40 selects a temperature compensation diode to be operated among the plurality of temperature compensation diodes 26, 27, and 28 using the switch 41. The setting unit 40 selects a temperature compensation diode to apply a breakdown voltage to the APD 11 as a bias voltage, by switching ON/OFF of the switch 41. The setting unit 40 selects a temperature compensation diode to be used for controlling the bias voltage among the plurality of temperature compensation diodes 26, 27, and 28 so that "ΔV" calculated by substituting the gain to be set in the APD 11 into "$M_d$" in Equation (4) becomes a difference voltage.

The breakdown voltage of the selected temperature compensation diode corresponds to a potential difference between the potential applied to the terminal 25 corresponding to the temperature compensation diode and the potential applied to the terminal 22. Therefore, a potential corresponding to the breakdown voltage of the selected temperature compensation diode is applied to the anode of the APD 11. As a result, a voltage corresponding to the breakdown voltage of the selected temperature compensation diode is applied to the APD 11 as a bias voltage.

In the present embodiment, when operating the temperature compensation diode 28, the setting unit 40 sets all the temperature compensation diodes 26, 27, and 28 to the state capable of being electrically energized. That is, the setting unit 40 turns on all of the switches 41 connected to the plurality of terminals 25. In this case, the temperature compensation diode 28 has a lowest breakdown voltage among the temperature compensation diodes 26, 27, and 28 set in the state capable of being electrically energized, so that the temperature compensation diode 28 operates. That is, the breakdown voltage of the temperature compensation diode 28 is applied to the APD 11 as a bias voltage.

When operating the temperature compensation diode 27, the setting unit 40 sets the temperature compensation diodes 26 and 27 to the state capable of being electrically energized, and sets the temperature compensation diode 28 to the state incapable of being electrically energized. In the present embodiment, the setting unit 40 turns on the switch 41 connected to the terminal 25 corresponding to the temperature compensation diode 27, and turns off the switch 41 connected to the terminal 25 corresponding to the temperature compensation diode 28. Since the switch 41 is not connected to the terminal 25 corresponding to the temperature compensation diode 26, the temperature compensation diode 26 is in the state capable of being electrically energized. In this case, the temperature compensation diode 27 has a lowest breakdown voltage between the temperature compensation diodes 26 and 27 set in the state capable of being electrically energized, so that the temperature compensation diode 27 operates. That is, the breakdown voltage of the temperature compensation diode 27 is applied to the APD 11 as a bias voltage.

When operating the temperature compensation diode 26, the setting unit 40 sets the temperature compensation diode 26 to the state capable of being electrically energized, and sets the temperature compensation diodes 27 and 28 to the state incapable of being electrically energized. In the present embodiment, the setting unit 40 turns off the switch 41 connected to the terminal 25 corresponding to the temperature compensation diodes 27 and 28. Since the switch 41 is not connected to the terminal 25 corresponding to the temperature compensation diode 26, the temperature compensation diode 26 is set in the state capable of being electrically energized. In this case, the temperature compensation diode 26 set in the state capable of being electrically energized operates. That is, the breakdown voltage of the temperature compensation diode 26 is applied to the APD 11 as a bias voltage.

Figure 6:
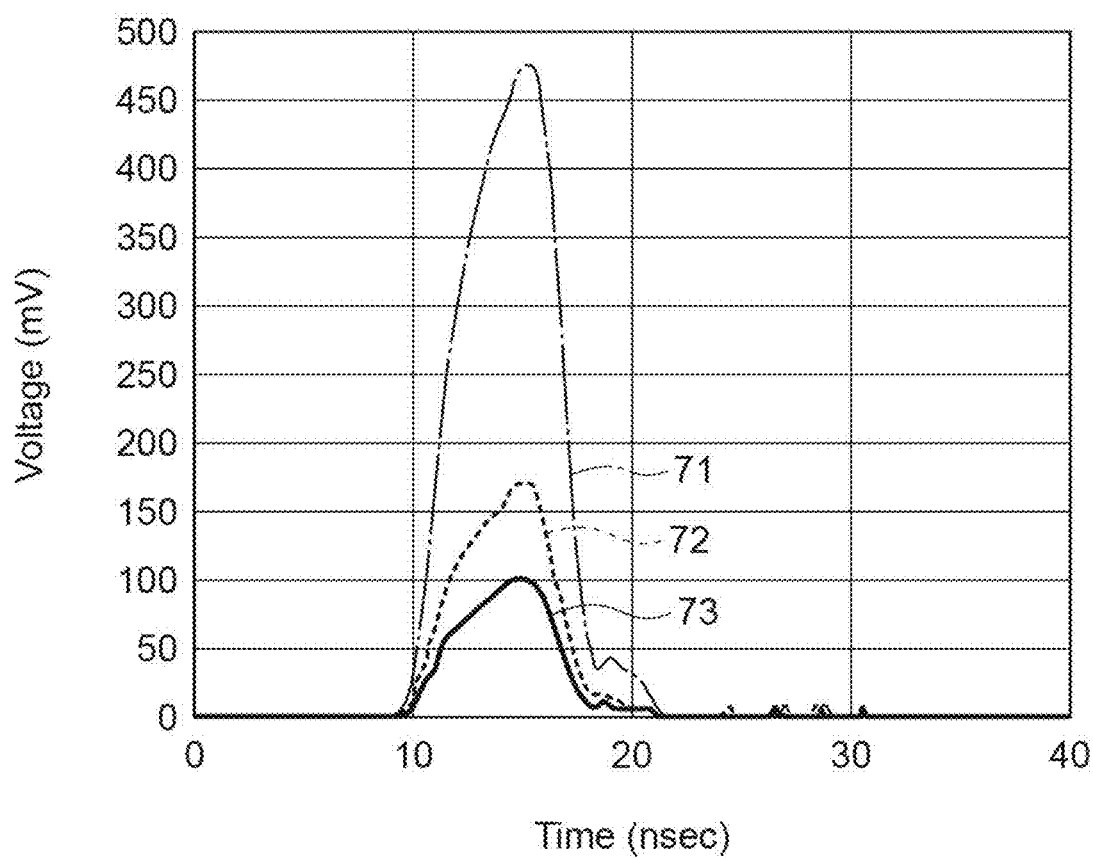
FIG. 6 is a graph illustrating the output characteristics of an APD according to the setting by a setting unit.

According to the operation described above, the gain of the APD 11 is selected by the setting unit 40. FIG. 6 is a graph illustrating the output characteristics of the APD 11 according to the setting by the setting unit 40. In FIG. 6, the vertical axis indicates the output voltage of the APD 11, and the horizontal axis indicates time. Each piece of data 71, 72, and 73 indicates the output characteristics of the APD 11 when pulsed light with the strength equal to each other enters the APD 11. The data 71 indicates the output characteristics of the APD 11 in a state in which the temperature compensation diode 26 is operating. The data 72 indicates the output characteristics of the APD 11 in a state in which the temperature compensation diode 27 is operating. The data 73 indicates the output characteristics of the APD 11 in a state in which the temperature compensation diode 26 is operating.

As illustrated in FIG. 6, the output peak of the APD 11 in a state in which the temperature compensation diode 26 is operating is larger than the output peak of the APD 11 in a state in which the temperature compensation diode 27 is operating. The output peak of the APD 11 in a state in which the temperature compensation diode 27 is operating is larger than the output peak of the APD 11 in a state in which the temperature compensation diode 28 is operating. Thus, it has been confirmed that an operating temperature compensation diode 26, 27, 28 is switched by the setting unit 40, so that the gain of the APD 11 is selected.

In the present embodiment, the setting unit 40 sets the temperature compensation diode 26 to a state capable of being electrically energized, regardless of whether or not the temperature compensation diode 28 is in a state capable of being electrically energized. In a state incapable of electrically energizing the temperature compensation diode 28, the setting unit 40 switches by the switch 41 between a state capable of electrically energizing the temperature compensation diode 27 and a state incapable of electrically energizing the temperature compensation diode 27. Hereinafter, a case where the temperature compensation diode 28 is selected as a temperature compensation diode to be operated by the setting unit 40 will be described as an example.

In the present embodiment, since a combination of the electromotive force generation unit 31 and the current limiting unit 32 is connected to the terminal 22, the breakdown voltage of the selected temperature compensation diode 28 is applied to the terminal 22. In the present embodiment, the output voltage of the electromotive force generation unit 31 is equal to or higher than the operating voltage of the APD 11. In other words, the output voltage of the electromotive force generation unit 31 is equal to or higher than the upper limit of the temperature change of the breakdown voltage of each temperature compensation diode 26, 27, 28. For example, the output voltage of the electromotive force generation unit 31 is 300 V or higher. The current limiting unit 32 is configured to include, for example, a current mirror circuit or a resistor.

The gain of the APD 11 can be arbitrarily set according to the breakdown voltage difference between the selected temperature compensation diode 28 and the APD 11. When the gain of the APD 11 is set to an optimal multiplication factor Mopt having a high S/N ratio, the detection accuracy can be improved.

In the present embodiment, the anodes of the APD 11 and the temperature compensation diodes 26, 27, and 28 are integrally formed in the semiconductor layer 55. For example, when the potential applied to the terminal 25 is 0 V and the breakdown voltage of the selected temperature compensation diode 28 is 130 V under an ambient temperature of 25° C., a potential of −130 V is applied to the anode of the APD 11. Therefore, when the breakdown voltage of the APD 11 is 150 V under an ambient temperature of 25° C., the APD 11 operates in a state in which the potential difference between the anode and the cathode is lower by 20 V than the breakdown voltage.

As described above, the APD 11 and the temperature compensation diodes 26, 27, and 28 have the same temperature characteristics with respect to the relationship between the gain and the bias voltage. Therefore, as long as the selected temperature compensation diode 28 is in a breakdown state, the APD 11 operates while maintaining the gain of a case in which a bias voltage lower by 20 V than the breakdown voltage is applied under an ambient temperature of 25° C. In other words, in the light detection device 1, a voltage that causes the selected temperature compensation diode 28 to break down is applied to the temperature compensation diode 28, so that temperature compensation is provided for the gain of the APD 11.

Next, the operational effects of the light detection devices in the above-described embodiment and modification examples will be described. Conventionally, when manufacturing a light detection device including an APD and a temperature compensation diode having the same temperature characteristics, it has been necessary to select and combine APDs having desired temperature characteristics with respect to the relationship between the gain and the bias voltage. For this reason, it has been difficult to reduce the cost. In this regard, in the light detection device 1, the APD 11 and the temperature compensation diodes 26, 27, and 28 are independently formed on the same semiconductor substrate 50. In this case, the temperature compensation diodes 26, 27, and 28 and the APD 11 having the same temperature characteristics over a wide temperature range with respect to the gain and the bias voltage are formed more easily and accurately than in a case where the temperature compensation diodes 26, 27, and 28 and the APD 11 are formed on mutually different semiconductor substrates. Therefore, temperature compensation for the gain of the APD 11 can be provided while suppressing the manufacturing cost.

The semiconductor substrate 50 includes the semiconductor region 51 of the first conductive type. Each of the APD 11 and the temperature compensation diodes 26, 27, and 28 includes the semiconductor layer 52 and the semiconductor layer 53. In the semiconductor substrate 50, the semiconductor layer 52 is a second conductive type. The semiconductor layer 53 is a first conductive type having a higher impurity concentration than the semiconductor region 51. The semiconductor layer 53 is located between the semiconductor region 51 and the semiconductor layer 52. As described above, the temperature compensation diodes 26, 27, and 28 have the same configuration as the APD 11. Therefore, it is possible to easily form the temperature compensation diodes 26, 27, and 28 whose temperature characteristics with respect to the gain and the bias voltage are very similar to that of the APD 11.

In the semiconductor substrate 50, the impurity concentration in the semiconductor layer 53 of each of the temperature compensation diodes 26, 27, and 28 is higher than the impurity concentration in the semiconductor layer 53 of the APD 11. In this case, in the light detection device 1, for example, the breakdown voltage of the APD 11 is higher than the breakdown voltage of each of the temperature compensation diodes 26, 27, and 28. As a result, temperature compensation for the gain of the APD 11 arranged to operate in linear mode is provided.

In the light detection device 1, the difference voltage to obtain the desired gain is determined by substituting the slope of the regression line having "$(1/M) \times (dM/dV_r)$" as an objective variable and "M" as an explanatory variable into "a" in Equation (4) and substituting the intercept of the regression line into "b" in Equation (4). Therefore, a desired gain can be obtained very easily without strictly considering the ambient temperature.

The temperature compensation unit 15 includes the temperature compensation diodes 26, 27, and 28. The temperature compensation unit 15 applies a voltage corresponding to the breakdown voltage, which is applied to any one of the temperature compensation diodes 26, 27, and 28, to the APD 11 as a bias voltage. For example, when the temperature compensation diode 28 is in a breakdown state, the difference voltage corresponds to a subtraction value obtained by subtracting a voltage corresponding to the breakdown voltage of the temperature compensation diode 28 from the breakdown voltage of the APD 11. Therefore, it is possible to derive "ΔV" to obtain the desired gain and design the impurity concentrations of the APD 11 and the temperature compensation diodes 26, 27, and 28 so that the subtraction value becomes "ΔV".

The light detection device 1 includes the setting unit 40 and the wiring unit 21. The setting unit 40 sets the temperature compensation unit 15 according to the gain to be set in the APD 11. The wiring unit 21 electrically connects the temperature compensation unit 15 and the APD 11 to each other. The plurality of temperature compensation diodes 26, 27, and 28 have mutually different breakdown voltages. The wiring unit 21 applies, to the APD 11 as a bias voltage, a voltage corresponding to the breakdown voltage of each of the temperature compensation diodes 26, 27, and 28. The setting unit 40 sets a temperature compensation diode to be used for controlling the bias voltage among the plurality of temperature compensation diodes 26, 27, and 28 so that "ΔV" calculated by substituting the gain to be set in the APD 11 into "$M_d$" in Equation (4) becomes a difference voltage. As a result, a temperature compensation diode to be used for controlling the bias voltage among the plurality of temperature compensation diodes 26, 27, and 28 is set by the setting unit 40. Therefore, a gain desired according to the situation can be obtained very easily without strictly considering the ambient temperature. In other words, it is possible to easily switch a desired gain and obtain the desired gain in a stable manner with respect to temperature.

The circuit unit 3 electrically connects the APD 11 and the temperature compensation diodes 26, 27, and 28 to the terminal 22 in parallel with each other. In this configuration, when any one of the plurality of temperature compensation diodes 26, 27, and 28 is in a breakdown state, the breakdown voltage of the temperature compensation diode in the breakdown state is applied to the APD 11 as a bias voltage. As a result, the difference voltage between the breakdown voltage of the APD 11 and the bias voltage applied to the APD 11 is set, and the APD 11 has a gain corresponding to the difference voltage. Therefore, according to a temperature compensation diode that breaks down, a gain desired according to the situation can be obtained in a stable manner with respect to temperature in the APD 11.

The circuit unit 3 includes at least one switch 41. The switches 41 are electrically connected to the corresponding temperature compensation diodes 27 and 28. The switches 41 switch between a state capable of electrically energizing the corresponding temperature compensation diodes 27 and 28 and a state incapable of electrically energizing the corresponding temperature compensation diodes 27 and 28. The plurality of temperature compensation diodes 26, 27, and 28 include the temperature compensation diode 26 and the temperature compensation diode 28. The temperature compensation diode 26 has a higher breakdown voltage than the temperature compensation diode 28. The switch 41 is electrically connected to the temperature compensation diode 28. In this case, when the temperature compensation diode 28 is set to a state capable of being electrically energized by the switch 41, the temperature compensation diode 28 preferentially breaks down even if the temperature compensation diode 26 is in a state capable of being electrically energized. In this manner, it is possible to switch a gain desired according to the situation in the APD 11 with simple control.

At least one switch 41 is connected to the corresponding terminal 25. A high voltage is applied between the electrode 29a of each of the temperature compensation diodes 26, 27, and 28 and the APD 11. Therefore, a control in a case where the switch 41 is electrically connected to the electrode 29b through the terminal 25 can be easier than that in a case where the switch 41 is disposed between the electrode 29a and the APD 11.

The circuit unit 3 is configured to set the temperature compensation diode 26 into a state capable of being electrically energized regardless of whether or not to be capable of electrically energizing the temperature compensation diode 28. In this case, even if the temperature compensation diode 28 is damaged or a local temperature change occurs in the vicinity where the temperature compensation diode 28 is disposed, the temperature compensation diode 26 breaks down. Therefore, the flow of a large current to the APD 11 is prevented, and the failure of the light detection device 1 is prevented.

The plurality of temperature compensation diodes 26, 27, and 28 further include the temperature compensation diode 27. The temperature compensation diode 27 has a breakdown voltage that is higher than the breakdown voltage of the temperature compensation diode 28 and lower than the breakdown voltage of the temperature compensation diode 26. The switch 41 is electrically connected to the temperature compensation diode 27. In a state incapable of electrically energizing the temperature compensation diode 28, the circuit unit 3 is configured to switch by the switch 41 between a state capable of electrically energizing the temperature compensation diode 27 and a state incapable of electrically energizing the temperature compensation diode 27. In this case, in a state capable of electrically energizing the temperature compensation diode 28, the temperature compensation diode 28 breaks down. In a state incapable of electrically energizing the temperature compensation diode 28, the temperature compensation diode 27 breaks down when the temperature compensation diode 27 is set in a state capable of being electrically energized. In a state incapable of electrically energizing the temperature compensation diode 28, the temperature compensation diode 26 breaks down when the temperature compensation diode 27 is set in a state incapable of being electrically energized. In this manner, it is possible to switch a gain desired according to the situation in the APD 11 with simple control.

Figure 7:
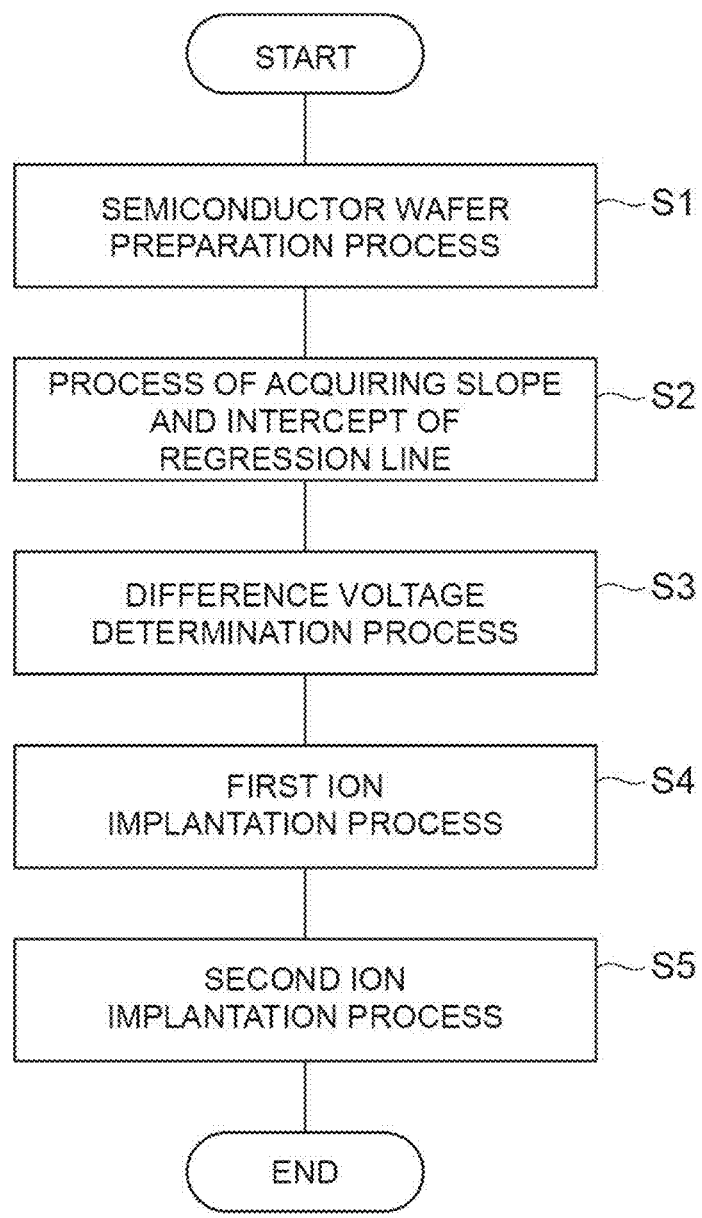
FIG. 7 is a flowchart illustrating a semiconductor substrate manufacturing method.

Next, an example of a method for manufacturing a light detection device will be described with reference to FIG. 7. FIG. 7 is a flowchart illustrating a method for manufacturing the semiconductor substrate 50 in the light detection device 1.

First, a semiconductor wafer is prepared (process S1). The semiconductor wafer is a substrate before being processed as the semiconductor substrate 50, and has main surfaces 50a and 50b facing each other. The semiconductor wafer has a first conductive type semiconductor region corresponding to the semiconductor region 51. The semiconductor region is provided on the main surface 50a side of the semiconductor wafer, and forms the entire main surface 50a. For example, the semiconductor region of the semiconductor wafer is P⁻ type. In the present embodiment, the semiconductor layer 55 of the first conductive type, which has an impurity concentration higher than the semiconductor region of the semiconductor wafer, is formed in the semiconductor wafer by adding impurities from the main surface 50b side. For example, the semiconductor layer 55 is P⁺ type.

Subsequently, the difference voltage between the breakdown voltage of the APD 11 and the bias voltage applied to the APD 11 is determined. The determination method is as follows.

First, the slope and intercept of the regression line, which has "$(1/M) \times (dM/dV_r)$" as an objective variable and "M" as an explanatory variable in the data indicating the correlation between the bias voltage applied to the APD and the gain of the APD, are obtained (process S2). Here, "$V_r$" is a bias voltage applied to the APD, and "M" is the gain of the APD to which the bias voltage is applied. The above data used in process S2 corresponds to a separate body having the same material and structure as the APD 11.

Then, the difference voltage to obtain the desired gain is determined by using the result obtained in process S2 and Equation (4) (process S3). The above difference voltage corresponds to "ΔV" calculated by substituting the obtained slope into "a" in Equation (4), substituting the obtained intercept into "b" in Equation (4), and substituting the desired gain to be set in the APD 11 into "$M_d$" in Equation (4). In the present embodiment, a plurality of values different from each other are determined as a gain to be set in the APD 11, and a plurality of difference voltages described above are determined for these values. A plurality of "ΔV" calculated by substituting a plurality of values different from each other into "$M_d$" in Equation (4) are determined as the difference voltages corresponding to the plurality of values.

Subsequently, as first ion implantation process (process S4), impurity ions are implanted to the main surface 50a side using an ion implantation method to add impurities, forming the second conductive type semiconductor layer 52 and the first conductive type semiconductor layers 53 and 54. For example, the semiconductor layer 52 is N⁺ type, the semiconductor layer 53 is P type, and the semiconductor layer 54 is P⁺ type. In the present embodiment, the semiconductor layer 52 is formed by implanting second conductive type impurity ions into different portions spaced apart from each other in one ion implantation process. The semiconductor layer 53 is formed by implanting first conductive type impurity ions after the semiconductor layer 52 is formed. The semiconductor layer 53 may be formed by implanting first conductive type impurity ions before the semiconductor layer 52 is formed.

The semiconductor layers 52 and 53 are formed at locations overlapping each other when viewed from the direction perpendicular to the main surface 50a. The semiconductor layer 53 is formed by implanting first conductive type impurities at a location deeper than the semiconductor layer 52 when viewed from the main surface 50a side. The semiconductor layers 52 and 53 are formed at a plurality of portions spaced apart from each other when viewed from the direction perpendicular to the main surface 50a, in a region serving as one semiconductor substrate 50. The plurality of portions include a portion where the APD 11 is disposed and a portion where each of the temperature compensation diodes 26, 27, and 28 is disposed. In the first ion implantation process, second conductive type impurities are added to each portion so that the impurity concentration of the semiconductor layer 52 is the same. Similarly, first conductive type impurities are added to each portion so that the impurity concentration of the semiconductor layer 53 is the same.

Subsequently, as second ion implantation process (process S5), impurities are further added only to the semiconductor layer 53 in some of the above-described plurality of portions by using an ion implantation method. In the present embodiment, the first conductive type impurities are further implanted into the semiconductor layer 53 only in a portion where each of the temperature compensation diodes 26, 27, and 28 is disposed. Accordingly, in the light detection device 1, the impurity concentration in the semiconductor layer 53 of each of the temperature compensation diodes 26, 27, and 28 is higher than the impurity concentration in the semiconductor layer 53 of the APD 11. In this case, the light detection device 1 is configured such that the breakdown voltage of the APD 11 is higher than the breakdown voltage of each of the temperature compensation diodes 26, 27, and 28.

The amount of the first conductive type impurities implanted into the semiconductor layer 53 of each of the temperature compensation diodes 26, 27, and 28 in processes S4 and S5 depends on the difference voltage determined in process S3. In the present embodiment, the amount of the first conductive type impurities implanted into the semiconductor layer 53 of the temperature compensation diode 28 is larger than the amount of the first conductive type impurities implanted into the semiconductor layer 53 of the temperature compensation diode 27. Therefore, the breakdown voltage of the temperature compensation diode 27 is configured to be larger than the breakdown voltage of the temperature compensation diode 28. The amount of the first conductive type impurities implanted into the semiconductor layer 53 of the temperature compensation diode 27 is larger than the amount of the first conductive type impurities implanted into the semiconductor layer 53 of the temperature compensation diode 26. Therefore, the breakdown voltage of the temperature compensation diode 26 is configured to be larger than the breakdown voltage of the temperature compensation diode 27.

In the second ion implantation process, the first conductive type impurities may be further implanted into the semiconductor layer 53 only in a portion where the APD 11 is disposed, not in a portion where each of the temperature compensation diodes 26, 27, and 28 is disposed. In this case, in the light detection device 1, the impurity concentration in the semiconductor layer 53 of each of the temperature compensation diodes 26, 27, and 28 is lower than the impurity concentration in the semiconductor layer 53 of the APD 11. In the light detection device 1 in this case, the breakdown voltage of the APD 11 is configured to be lower than the breakdown voltage of each of the temperature compensation diodes 26, 27, and 28.

By the processes described above, the semiconductor substrate 50 of the light detection device 1 is formed. Processes S2 and S3 may be performed before process S1 or after process S4. In the present embodiment, the semiconductor layers 52, 53, and 54 are formed from the state in which the semiconductor layer 55 has already been formed. However, the semiconductor layer 55 may be formed after the semiconductor layers 52, 53, and 54 are formed.

In the manufacturing method described above, the semiconductor layer 52 and the semiconductor layer 53 are formed in each portion by implanting ions into a plurality of different portions. Thereafter, ions are further implanted into the semiconductor layer 53 in some of the portions. Therefore, the plurality of temperature compensation diodes 26, 27, and 28 and the APD 11 each of which is set to the desired breakdown voltage can be easily manufactured while having the same temperature characteristics with respect to the gain and the bias voltage. In this case, the gain of the APD 11 can be arbitrarily set according to the difference voltage between the breakdown voltage of each of the temperature compensation diodes 26, 27, and 28 and the breakdown voltage of the APD 11. Therefore, when each of the temperature compensation diodes 26, 27, and 28 and the APD 11 is set to the desired breakdown voltage, the detection accuracy can be improved. For example, when the gain of the APD 11 is set to the optimal multiplication factor Mopt having a high S/N ratio according to the above difference voltage, the detection accuracy can be improved. Thus, in the manufacturing method described above, temperature compensation for the gain of the APD 11 is provided while suppressing the manufacturing cost, and the detection accuracy can be improved.

In the difference voltage determination method described above, the slope and intercept of the regression line, which has "$(1/M) \times (dM/dV_r)$" as an objective variable and "M" as an explanatory variable, are obtained. By substituting the obtained slope into "a" in Equation (4) and substituting the obtained intercept into "b" in Equation (4), the difference voltage to obtain the desired gain is determined. Therefore, the difference voltage to obtain the desired gain is determined very easily without strictly considering the ambient temperature.

In the determination method described above, a plurality of "$\Delta V$" calculated by each substituting a plurality of different values as gains to be set in the APD 11 into "$M_d$" in Equation (4) are determined as difference voltages corresponding to the plurality of values. Therefore, the plurality of difference voltages corresponding to the plurality of values are determined very easily without strictly considering the ambient temperature.

While the embodiment of the present invention and the modification examples have been described above, the present invention is not necessarily limited to the embodiment and the modification examples described above, and various changes can be made without departing from the scope of the present invention.

In the present embodiment, the configuration in which the so-called reach-through type APD 11 is arranged to operate in linear mode has been described. The light detection device 1 may have a configuration in which the reverse type APD 11 is arranged to operate in linear mode.

In the present embodiment, the light detection device 1 including the electromotive force generation unit 31, the current limiting unit 32, the bias voltage stabilization unit 33, and the setting unit 40 has been described. However, the light detection device according to the present embodiment may have a configuration in which at least one of the electromotive force generation unit 31, the current limiting unit 32, the bias voltage stabilization unit 33, or the setting unit 40 is not included. In this case, an external device connected to the light detection device may function as the electromotive force generation unit 31, the current limiting unit 32, the bias voltage stabilization unit 33, or the setting unit 40. The light detection device 1 may include a signal reading circuit (not illustrated).

In the present embodiment, the configuration has been described in which the switch 41 is connected to the terminal 25 of the light detection unit 20 and the switch 41 is controlled by the setting unit 40. However, the switch 41 may be disposed inside the light detection unit 20.

In the present embodiment, the terminals 22, 23, 24, and 25 have been described as pad electrodes. However, the terminals 22, 23, 24, and 25 may be configured by the semiconductor in the semiconductor substrate 50.

The switch 41 for switching the electrical connection between each of the temperature compensation diodes 26, 27, and 28 and the APD 11 may be disposed in the wiring unit 21, and ON/OFF of the switch 41 in the wiring unit 21 may be controlled by the setting unit 40. Also in this case, the setting unit 40 controls the bias voltage applied to the APD 11. Since a high voltage is applied between the APD 11 and each of the temperature compensation diodes 26, 27, and 28, the switch 41 connected to the terminal 25 is controlled more easily than in a case where the switch disposed in the wiring unit 21 is controlled.

The temperature compensation unit 15 may include a plurality of temperature compensation diodes having the same breakdown voltage. According to this configuration, even if a part of the temperature compensation diode is damaged or a local temperature change occurs in the vicinity where a part of the temperature compensation diode is disposed, the normal operation of the light detection device 1 can be realized.

REFERENCE SIGNS LIST

1: light detection device, 3: circuit unit, 11: APD, 22, 25: terminal, 26, 27, 28: temperature compensation diode, 41: switch.

The invention claimed is:
1. A light detection device, comprising:
an avalanche photodiode;
a plurality of temperature compensation diodes each of which includes first and second electrodes and which have mutually different breakdown voltages lower than a breakdown voltage of the avalanche photodiode; and
a circuit unit configured to cause any one of the plurality of temperature compensation diodes to break down,
wherein the circuit unit includes a plurality of first terminals, which are respectively connected to the second electrodes of the temperature compensation diodes, and a second terminal electrically connected to the avalanche photodiode and the first electrode of each of the temperature compensation diodes.
2. The light detection device according to claim 1,
wherein the circuit unit includes at least one switch electrically connected to a corresponding temperature compensation diode and configured to switch between a state capable of electrically energizing the corresponding temperature compensation diode and a state incapable of electrically energizing the corresponding temperature compensation diode,
the plurality of temperature compensation diodes include a first temperature compensation diode and a second temperature compensation diode having a higher breakdown voltage than the first temperature compensation diode, and
the switch is electrically connected to the first temperature compensation diode.
3. The light detection device according to claim 2,
wherein the at least one switch is connected to a corresponding first terminal.
4. The light detection device according to claim 2,
wherein the circuit unit is configured to be set to a state capable of electrically energizing the second tempera- ture compensation diode regardless of whether or not to be capable of electrically energizing the first temperature compensation diode.

5. The light detection device according to claim 4,
wherein the plurality of temperature compensation diodes further include a third temperature compensation diode having a breakdown voltage higher than a breakdown voltage of the first temperature compensation diode and lower than a breakdown voltage of the second temperature compensation diode,
the switch is electrically connected to the third temperature compensation diode, and
the circuit unit is configured to switch, by the switch, between a state capable of electrically energizing the third temperature compensation diode and a state incapable of electrically energizing the third temperature compensation diode, in a state incapable of electrically energizing the first temperature compensation diode.

\* \* \* \* \*